United States Patent [19]

Benjamin

[11] 3,878,550

[45] Apr. 15, 1975

[54] MICROWAVE POWER TRANSISTOR

[75] Inventor: James A. Benjamin, Boxford, Mass.

[73] Assignee: Raytheon Company, Lexington, Mass.

[22] Filed: Oct. 27, 1972

[21] Appl. No.: 301,555

[52] U.S. Cl. ........................ 357/36; 357/20; 357/48; 357/68

[51] Int. Cl. .............................................. H01l 11/00

[58] Field of Search .......... 317/235; 357/20, 36, 48, 357/68

[56] References Cited

UNITED STATES PATENTS

| | | | |
|---|---|---|---|
| 3,427,511 | 2/1969 | Rosenzweig | 317/235 |
| 3,582,723 | 6/1971 | Kerr | 317/235 |
| 3,582,726 | 6/1971 | Gilbert | 317/235 |
| 3,585,465 | 6/1971 | Imhauser | 317/235 |

*Primary Examiner*—Michael J. Lynch
*Assistant Examiner*—E. Wojciechowicz
*Attorney, Agent, or Firm*—John R. Inge; Joseph D. Pannone; Milton D. Bartlett

[57] ABSTRACT

A microwave power transistor system using diamond-shaped emitter and base regions to maximize the ratio of emitter periphery to base area and thereby maximize the gain of the device within manufacturing constraints. A plurality of transistor cells are arranged in a symmetrical array to facilitate both heat flow and ease of interconnection. A transistor phased array radar system has improved phase shift stability and does not require feedback correction.

8 Claims, 17 Drawing Figures

MICROWAVE POWER TRANSISTOR

BACKGROUND OF THE INVENTION

In transistors operating in the microwave region of the frequency spectrum, both the horizontal and vertical device geometries are important. Also, in considering any possible structure for the horizontal geometry, it must be kept in mind that there is a minimum width for any dimension within the device geometry that must be imposed from practical manufacturing constraints such as minimum metallization width.

Prior art attempts to construct microwave transistors have concentrated upon the use of square emitters in square base regions. If $w$ is the minimum dimension which may be defined due to manufacturing constraints, then a transistor with a square emitter can have an emitter metallic contact no smaller than $w$ by $w$. Leaving a spacing of $w$ between the emitter contact and the periphery of the emitter on all sides constrains the emitter size to $3w$ by $3w$. Also, a spacing of $w$ must be left between the peripheries of adjacent emitters. If a base area is defined on a unit basis, then it will extend halfway between the adjacent emitters and will thus have dimensions of $4w$ by $4w$. Hence, the base area will be $BA = (4w)^2 = 16w^2$ for an emitter periphery of $EP = 4 \times 3w = 12w$. The maximum achievable aspect ratio for a square emitter microwave power transistor is then $EP/BA = 12w/16w^2 = 3/4w$. For $w = 2\mu$, which is a value near the limit of what has previously been achieved, $EP/BA = 9.4$ mils$^{-1}$ (after converting units).

In the prior art, it has been customary to connect a plurality of transistors together within a single package. Usually the transistor cells, in the shape of rectangles, are laid side by side in a linear array. With this arrangement, there are heat dissipation problems as well as an increase in interelectrode capacitances due to the physical layout.

Prior art phased array radar systems have employed traveling wave tubes as amplifiers for each element in the array. Since the phase shift of a signal across such a tube varies among tubes and also with frequency, it was necessary to employ expensive and bulky ferrite phase shifters between the traveling wave tube output to achieve phase stabilization. Additionally, feedback circuits from the phase shifter output to the input circuit to the traveling wave tube were also frequently required for phase stabilization.

SUMMARY OF THE INVENTION

The frequency at which the available power gain of a transistor is unity may be expressed as $$F_{max} = \sqrt{\frac{f_t}{8\pi r_b C_c}} \text{ where,}$$

$F_{max}$ = the frequency where the available power gain is unity;

$f_t$ = a term or figure of merit which is primarily dependent upon the vertical geometry;

$r_b C_c$ = a term or figure of merit which is primarily dependent upon the horizontal geometry.

In a microwave transistor power device as in the present invention, $r_b$ is primarily an inverse function of emitter periphery EP, while $C_c$ is a direct function of base area BA. Hence, the maximum frequency at which the device is useful, namely $F_{max}$, may be improved by maximizing the ratio of emitter periphery to base area within the minimum width constraint. This ratio EP/BA is termed the aspect ratio and is a useful criterion for evaluating the effectiveness of a given device horizontal geometry. This ratio is expressed in units of mils$^{-1}$.

As with some prior art microwave power transistors, a device constructed in accordance with the teachings of the present invention employs multiple emitters deployed over the surface of the device. Multiple emitters are used since the periphery of the emitter is responsible for the majority of the current flowing from the emitter. Hence, it is desirable to maximize the emitter periphery.

Accordingly, it is an object of the present invention to provide a transistor with a maximal ratio of emitter periphery to base area. Secondly, it is an object of the present invention to provide a transistor which is relatively simple to fabricate. It is also an object of the present invention to provide a transistor device in which the individual transistors are arranged so as to facilitate heat dissipation and to minimize interelectrode capacitances.

The above objects of the present invention, as well as others, are met by providing a transistor having an emitter periphery to base area ratio of greater than $(5/6) \cdot (1/w)$ where $w$ is the smallest linear dimension along any element in the transistor.

Also, the objects of the present invention may be met with a device comprising a region of semiconductor material of a first conductivity type contiguous to a region of semiconductor material of a second conductivity type. A plurality of connections are provided to the region of semiconductor material of the second conductivity type. Contiguous to the region of semiconductor material of the second conductivity type are a plurality of regions of semiconductor material again of the first conductivity type, each of which is located substantially between four adjacent connections to the region of semiconductor material of the second conductivity type. Such a device may be used in a microwave communications system or in a radar system which may be a phased array radar system.

Furthermore, the objects of the present invention are met by providing a semiconductor planar substrate of a first conductivity type to which is contiguous a collector region of the same conductivity type with a base region of a second conductivity type contiguous to the collector region. A plurality of emitter regions having a substantially diamond shape and being of the first conductivity type are contiguous to the base region and are located substantially at the center of four adjacent connections to the base region. The first conductivity type may be N-type material while the second conductivity type may be P-type material.

In accordance with the present invention, a plurality of semiconductor device cells may be arranged in a substantially symmetrical array while means are provided to interconnect like elements among the cells. Like sides of each cell may be aligned towards the center of the substantially symmetrical array.

Also, in accordance with the present invention, there may be combined four transistor cells, rectangular in shape, which are arranged in a square with the longer sides of each cell in parallel with the sides of the square. Means with first and second planar surfaces are provided for support of the transistor cells. Means are provided to connect the emitters at the center of the square while means are provided to connect the bases on the periphery of the square on the first planar surface of the support means.

A semiconductor device may be constructed according to the present invention by first diffusing a planar epitaxial layer of a first conductivity type in one surface of a substrate of the first conductivity type where the epitaxial layer has greater resistivity than the substrate. Secondly, a first layer of oxide is deposited onto the surface of the epitaxial layer then the oxide is etched away in a relatively thin strip along the periphery of the layer of oxide. A guard ring layer of a second conductivity type and low resistivity is diffused through the thin strip into the epitaxial layer. The oxide is etched away inside the thin strip and a relatively thin layer of a second conductivity type is diffused in the area where the oxide was etched away. Then, a second layer of oxide, formed during the diffusion of the thin layer of the second conductivity type, is etched away in a plurality of substantially diamond-shaped regions which are deployed in transverse, substantially linear, rows and columns. A layer of the first conductivity type is diffused through each of the substantially diamond-shaped regions. The second layer of oxide is etched away in regions substantially at the center of four adjacent diamond-shaped regions. After a layer of metal is deposited over the surface of the device, the metal is etched in such a manner as to provide connection with the layer of the first conductivity type diffused through the substantially diamond-shaped regions and connection with the relatively thin layer of the second conductivity type through the regions located substantially at the center of four adjacent diamond-shaped regions.

BRIEF DESCRIPTION OF THE DRAWINGS

FIGS. 3A through 3L are a series of cross-sectional views of a transistor in different steps of the process;

DESCRIPTION OF THE PREFERRED EMBODIMENT

Figures 1, 6:
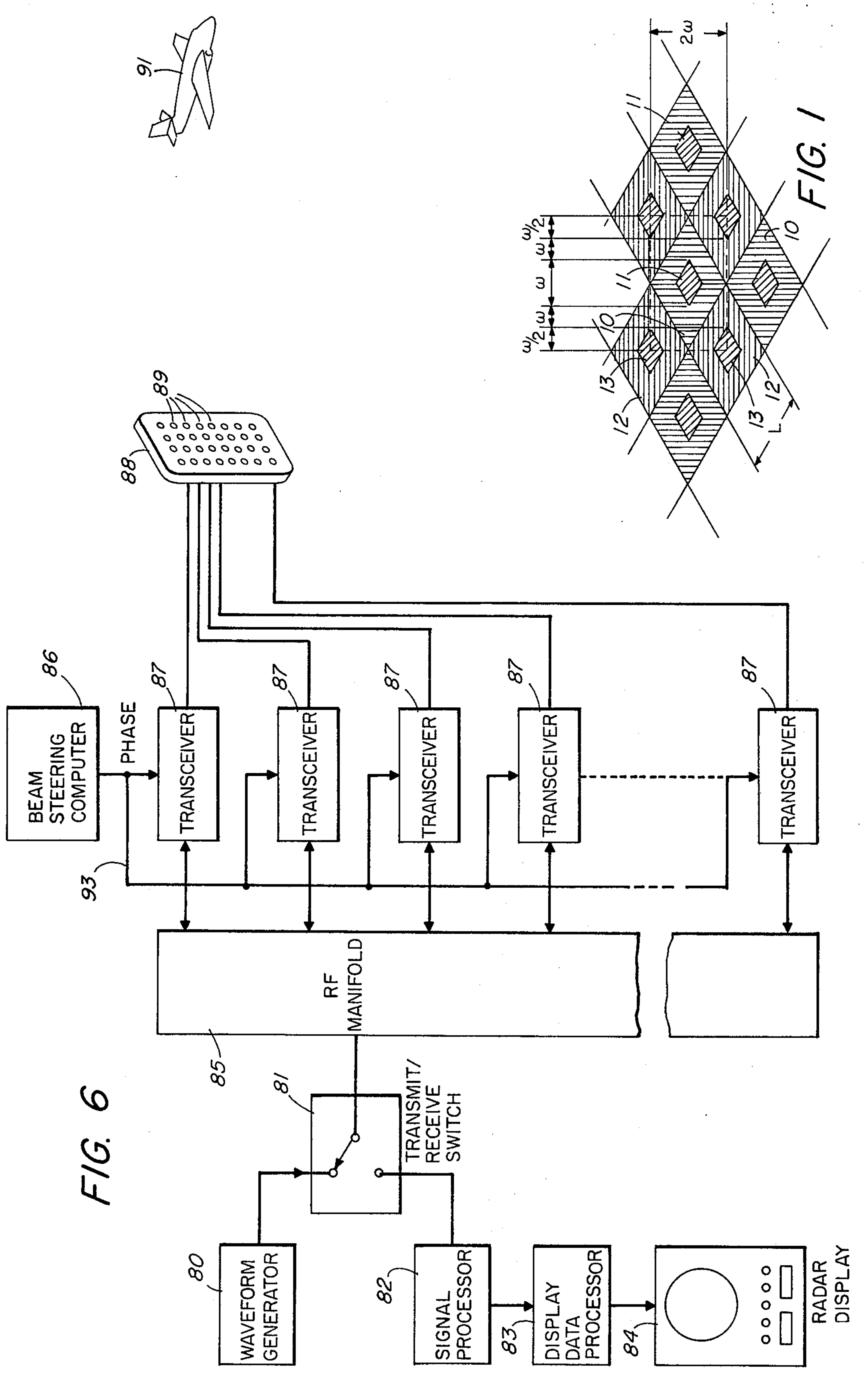
FIG. 1 is a cross-sectional view of a portion of a transistor constructed according to the present invention useful for pointing out relevant dimensions.
FIG. 6 is a block diagram of a phased array type radar system embodying the present invention.

In FIG. 6 is shown the block diagram of a phased array radar system in which transistors constructed according to the present invention are used. When the system is in the transmitting mode, the transmit/receive switch 81 connects the waveform generator 80 to the RF manifold 85. The waveform generator 80 may supply, for example, a chirped pulse of 20 usec. duration with a 1gH2 carrier frequency and with linear frequency modulation. The RF manifold 85 distributes the aforementioned pulse to the inputs of the transceivers 87. There is one such transceiver for each antenna element 89 within the phased array antenna 88. Typically, there may be from 2,500 to 10,000 elements in an antenna. A beam steering computer 86 supplies phase information on lines 93 to each transceiver 87 as the relative phase among antenna elements 89 determines the direction in which the antenna is aimed for both transmitting and receiving.

In actual operation, a pulse is transmitted towards a target such as airplane 91 and a return pulse is reflected back from the target to the antenna 88. The transceivers are switched into the receiving mode with the same relative phase among them as was set for the transmitting mode so that the system is directional for both transmitting and receiving modes of operation.

It is to be noted that with the present invention no feedback is required to stabilize the output phase from each transceiver. Furthermore, the phase shifting may be effected before final amplification thereby eliminating the need for bulky and expensive ferrite phase shifters which are necessary to shift phase at relatively high power levels such as in phased array systems employing traveling wave tubes for amplifiers.

Figure 5A:
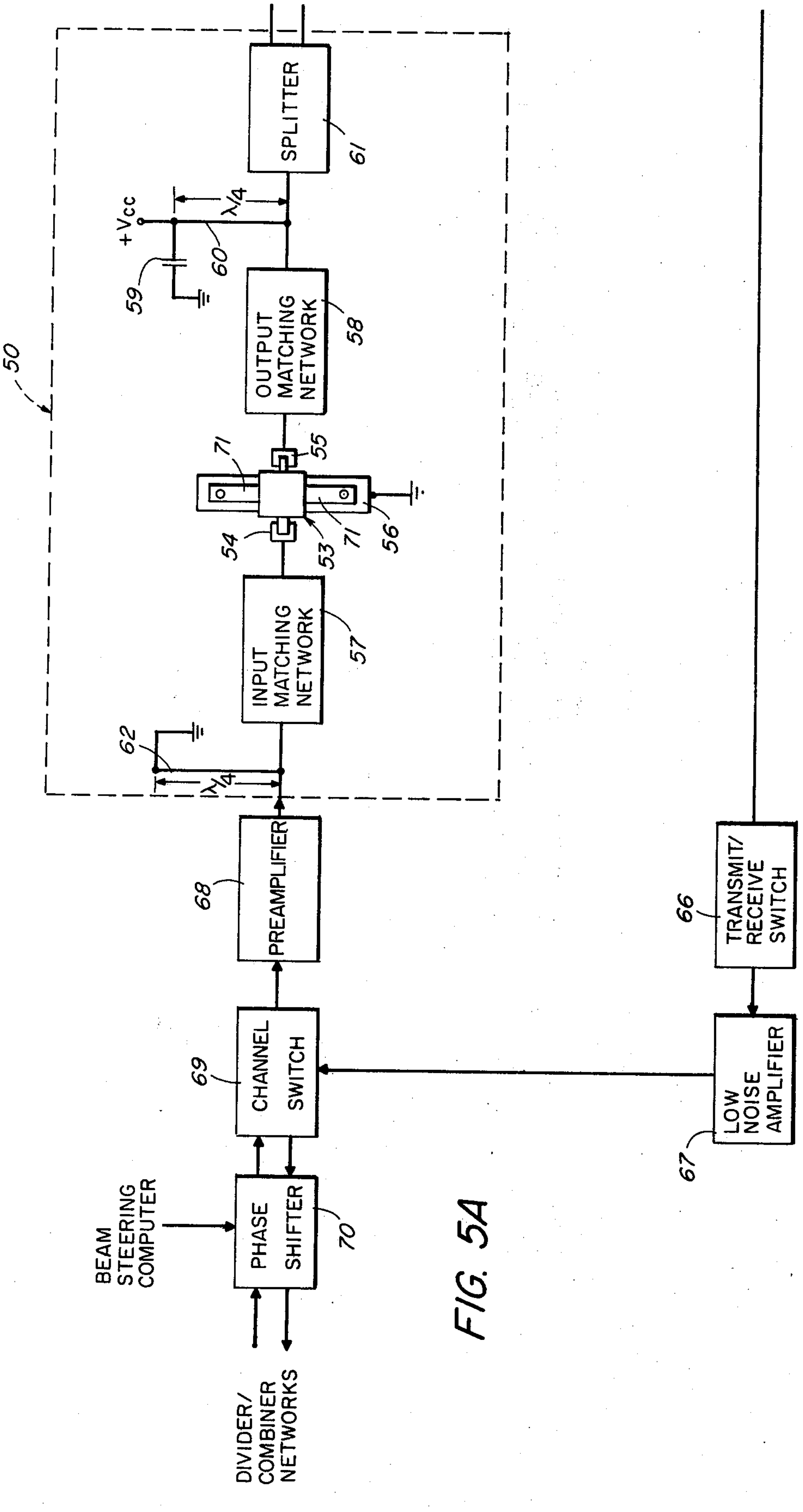
FIGS. 5A and 5B are circuit diagrams of a transmit/receive module embodying the present invention.
Figure 5B:
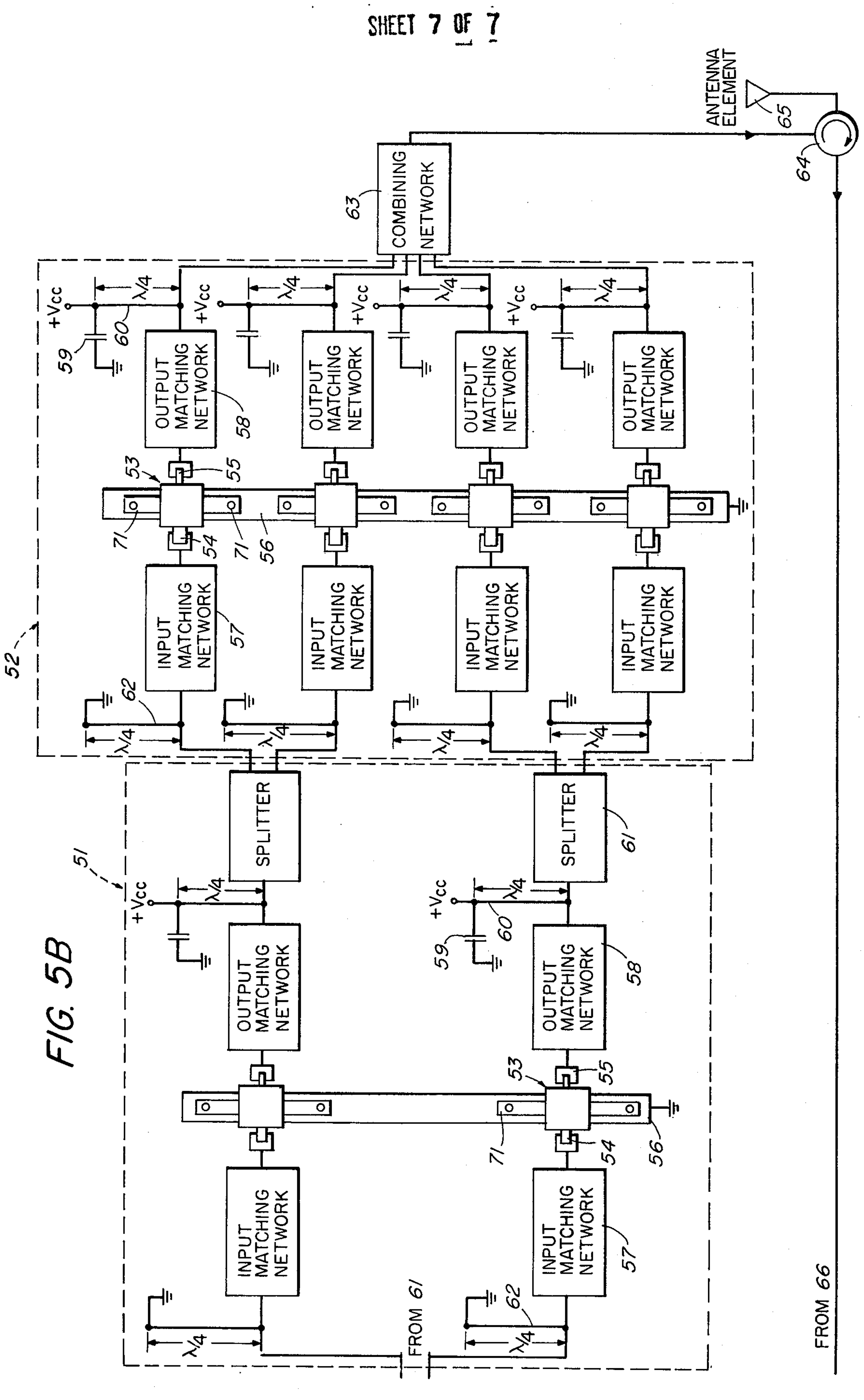

The phase shift method employed in the present invention is discussed in conjunction with the module shown in FIGS. 5A and 5B. One of the modules shown in FIGS. 5A and 5B is used in each of the transceivers 87 in FIG. 6.

In FIGS. 5A and 5B are shown the circuit diagram of a module used in each transceiver 87 of FIG. 6 employing a microwave transistor device constructed in accordance with the present invention. When the module shown in FIGS. 5A and 5B is in the transmitting mode, the operation is as follows. The unamplified input signal is connected from a source common to all circuits such as the one shown in FIGS. 5A and 5B to the input of the phase shifter 70 through the divider/combiner networks. The desired phase of the signal is set with the phase shifter 70 which is preferably a series combination of delay elements which may be switched in and out selectively by an external beam steering computer. A channel switch 69 couples the phase shifted unamplified signal to a preamplifier 68. The preamplifier 68, which is preferably operated as a Class A linear amplifier, boosts the signal prior to final amplification.

Three stages of final amplification are shown generally at 50, 51 and 52. The transistor device 53 in the first stage 50 drives two transistor devices 53 in the second stage 51 and each of the two transistor devices 53 in the second stage 51 drives two transistor devices 53 in the third stage 52. All of the transistor devices 53 in the three stages 50, 51 and 52 are preferably operated in Class C. The quarter wavelength tuning stub 62 and input matching network 57 are used to couple the signal from the preamplifier 68 to the emitter connection 54 of the transistor device 53. The transistor device 53 is operated in a common base configuration with the base, internally connected to the case, connected to ground through flanges 71. The flanges 71 may preferably be connected with screws to a grounding strip 56. An output matching network 58 couples the amplified signal from the collector connection 55 of the transistor device 53 to a splitter 61. A second quarter wavelength tuning stub is used to connect a DC bias voltage $V_{cc}$ to the collector since a quarter wavelength line appears as an open circuit to the signal. A bypass capacitor 59 acts as a connection to ground for the high frequency signal. The splitter 61 divides the amplified signal from the first stage 50 equally as to both phase and amplitude and couples the two new signals thus obtained to the two transistor devices 53 in the second stage 51. The same circuit arrangement is used in the second stage 51 and third stage 52 as in the first stage 50. The output signals from the four transistor devices 53 in the third stage 52 are added together in phase by combiner 63 and coupled to the antenna element 65 through a microwave circulator 64.

When the module is in the receiving mode, signals which have been transmitted and reflected from some distant object back to the antenna are coupled from the antenna element 65 by the microwave circulator 64 through a transmit/receive switch 66 to a low noise amplifier 67. The transmit/receive switch 66 is in an open circuit condition to prevent excessive energy from reaching and damaging the low noise amplifier 67 when the module is in the transmitting mode. The channel switch 69 routes the amplified return signal back through the phase shifter 70 and hence to the divider and combiner networks for processing along with return signals from other antenna elements within the phased array radar system.

FIG. 1 is a cross-sectional view showing several of the diamond-shaped emitters and bases of a microwave transistor constructed according to the teachings of the present invention. Here, a minimum realizable dimension w is imposed along the width of a base contact 13 or an emitter contact 11. A spacing of w is left between the edges of these contacts so that a spacing of w will separate the metal fingers which interconnect the bases and emitters. In the particular embodiment illustrated here, the contacts have major axis to minor axis ratio of 2:1. The aspect ratio for the device may thus be computed as follows:

L = length of a side of an emitter region $$L = \sqrt{(2w)^2 + w^2} = \sqrt{5}\, w$$

The base area defined on a unit cell basis is the rectangle outlined in dotted lines and is of area:

$$BA = (4w)\,(2w) = 8w^2$$

The emitter periphery is the length of the edge of a diamond and is:

$$EP = 4L = 4\sqrt{5}\, w$$

The aspect ratio is then:

$$EP/BA = \frac{4\sqrt{5}\,w}{8w^2} = \frac{\sqrt{5}}{2w}$$

For the assumed case of $w = 2\mu$, $EP/BA = 28.0$ mils$^{-1}$ which is an appreciable improvement over the aspect ratio for the square geometry as computed earlier. Alternatively the minimum dimension $w$ can be defined as being the distance along an edge of a base contact 13 or an emitter contact 11. In that case, the aspect ratio is calculated to be $(5/6) \cdot (1/w)$.

Figure 2:
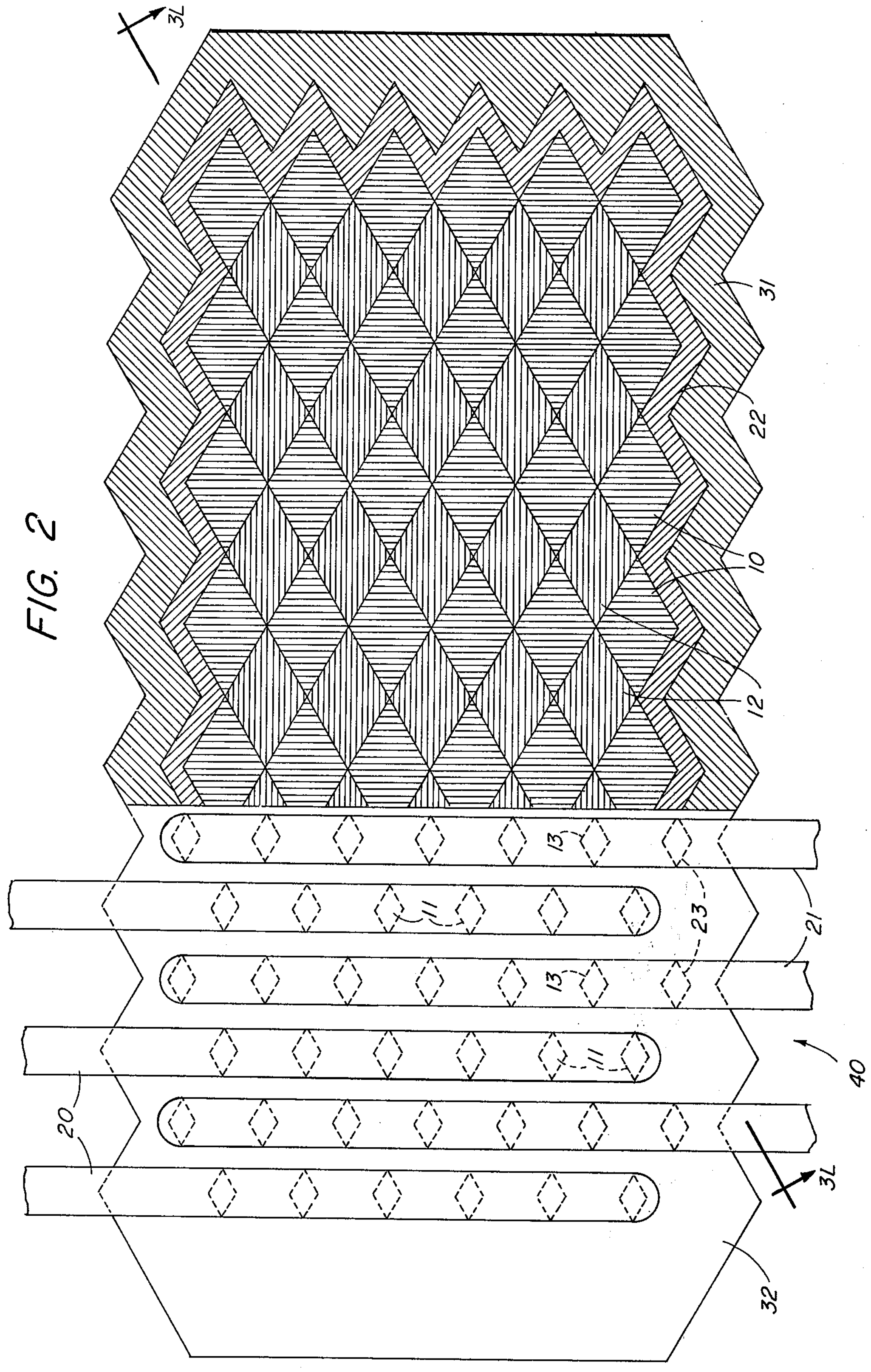
FIG. 2 is a plan view of a transistor constructed according to the present invention illustrating a method for connecting the base and emitter regions.

Referring now to FIG. 2, there is illustrated a transistor device with the structure of the present invention. The diamond-shaped emitter regions 10 are aligned in rows and columns such that the diagonals of the diamonds are in alignment rather than the sides. The base regions 12 are of substantially the same shape as the emitter regions 10 and are deployed between the emitter regions 10 thus forming rows and columns in the same manner. The base region also extends under the emitter regions 10 separating the emitter regions 10 from the collector 31. The emitter contacts 11 are preferably metal and of the same shape as the emitter regions 10 but of proportionately smaller dimensions. These contacts are positioned substantially in the center of the emitter region 10 and are in alignment with one another. In one embodiment of the invention, the contacts are aluminum doped with the same dopant type as the region they are in contact with so as not to pollute the region. Metal fingers 20 lie on top of the emitter contacts 11 and serve to interconnect them. Similarly, the base contacts 13 are preferably made of metal and of the same shape although of proportionately smaller dimensions than the base regions 12. These contacts are connected together by metal fingers 21 which are positioned on top of the contacts. As will be shown later, both sets of metal fingers are connected among themselves so that in the final construction of the device there is provided a single base contact and a single emitter contact. The metal fingers 21 which connect the base contacts 13 also connect with the guard contacts 23.

As is illustrated in FIGS. 3A through 3L, the base regions 12 are formed during a single diffusion and continuously underlie the emitters, while the collector region lies underneath the base. Thus, the only nonplanar interface between the base and collector is formed along the edges of the device beyond the areas containing the emitter regions 10. This interface is rounded because the base is formed preferably by diffusion techniques. Since the base is relatively thin, for example $0.5\mu$, the radius of curvature between the base and collector at this interface tends to be relatively small. The small radius of curvature gives rise to a high concentration of electric field emanating from the edge of the base region when a reverse bias voltage is applied between the base and collector as is done in normal device operation. This high field concentration would cause a lowering of the base to collector breakdown voltage were a guard ring 22 not provided between the base and collector at the edge of the base. The guard ring 22 is of the same conductivity type as the base region and is diffused into the collector so as to include the edge where the base would otherwise contact the collector. Since the guard ring 22 is diffused into the collector with a much larger radius of curvature than the base edge would have, the field concentration in the region is correspondingly reduced thereby increasing the base to collector breakdown voltage. The resistivity of the guard ring 22 is small compared to that of the base to insure that the contribution to the total bulk resistance of the base due to the guard ring 22 is small so that the frequency response of the device is not adversely affected by this parameter.

Figure 3A:
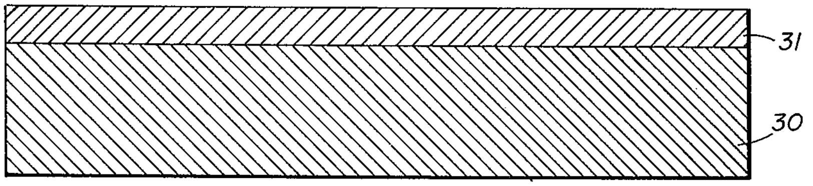

FIG. 3A et seq. show a transistor of the type of FIG. 2 in various stages of fabrication. In FIG. 3A is shown a silicon substrate 30 which has been cut from a rod of substantially monocrystalline silicon which has been grown by well-known techniques. The substrate 30 is of sufficient thickness, for example, 10 mils, to provide mechanical support for the device. The resistivity of the substrate 30 is relatively low, such as in the range of 0.001 to 0.01Ω-cm. This epitaxial layer 31, which forms the collector of the transistor, has a typical thickness of 6 to $8\mu$.

Since the substrate 30 is of much greater thickness than the epitaxial layer 31 and since succeeding operations depicted from FIGS. 3B to 3L take place wholly in or on top of the epitaxial layer 31, FIGS. 3B to 3L omit the substrate 30 and show the epitaxial layer 31 on a larger scale than at 101.

Figure 3B:
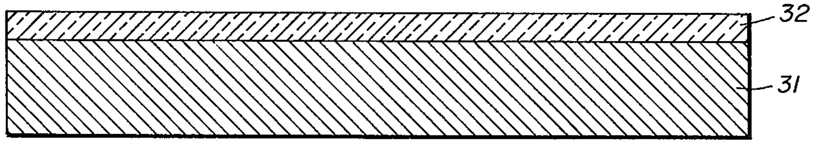

In FIG. 3B, a layer of oxide, preferably silicon dioxide and typically of 5,000A in thickness, is deposited on top of the epitaxial layer 31. A preferred method to deposit the oxide is through thermal decomposition of semiconductive material. The layer may be grown in an oven at a temperature of approximately 1,000°C in a steam atmosphere.

Figure 3C:
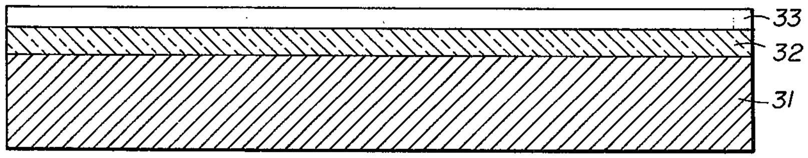

A photoresistive material 33 is deposited upon the oxide layer 32 as shown in FIG. 3C in preparation for photoetching of the oxide layer 32. The photoetching process used here follows well-known procedures whereby the photoresistive material 33 is masked, exposed to light, and developed so that the photoresistive material 33 may be washed away in those areas where it is desired to etch the oxide layer 32 through to the underlying semiconductive material in preparation for diffusion of the base and emitter regions.

Figure 3D:
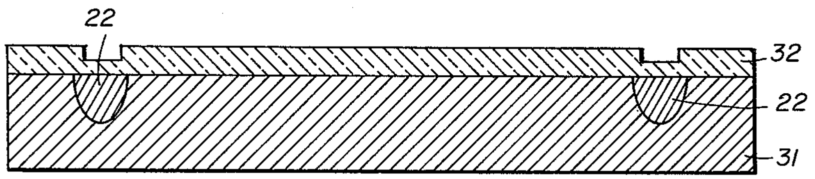
Figure 3E:
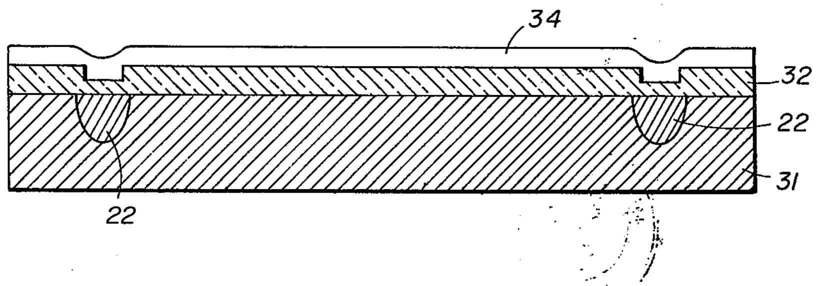

The illustration in FIG. 3D shows the oxide layer 22 has been etched away near the periphery of the epitaxial layer 31 and the guard ring 22 has been diffused into the epitaxial layer 31 as in FIG. 2 by well-known techniques.

Figure 3F:
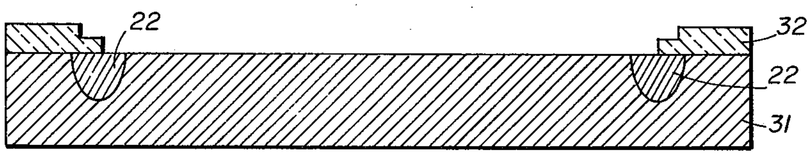
Figure 3G:
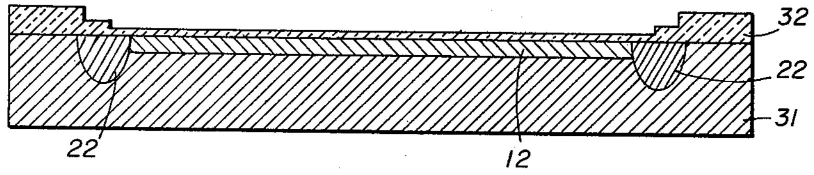

A second photoresistive layer 34 is deposited as shown in FIG. 3D in preparation for etching the oxide layer 32 over the surface of the device where the base region 12 is to be diffused. The device before diffusion of the base 12 is shown in FIG. 3F while the device with the base diffused into the epitaxial layer 31 with its edges extending into the guard ring 22 is shown in FIG. 3G. As is shown in FIGS. 3D and 3G, a thin layer of oxide forms during each diffusion.

Figure 3H:
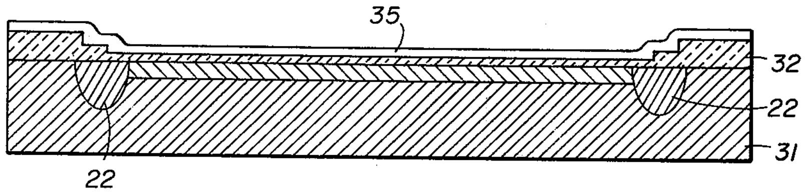
Figure 3J:
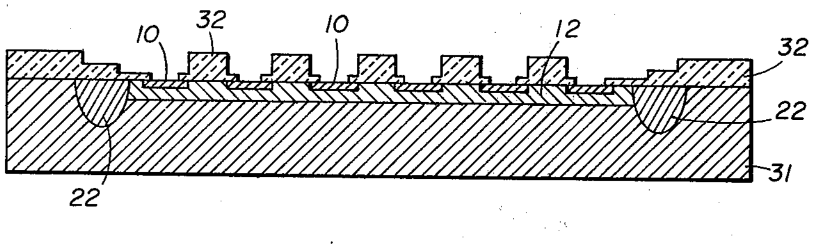

In FIG. 3H, a third layer of photoresistive material 35 is deposited in preparation for diffusion of the emitter regions 10. In FIG. 3J, the oxide has been etched away from the emitter locations, the emitters have been diffused into the base and the oxide which was formed during emitter diffusion has been etched away. The emitters are diffused in the diamond shape and in the pattern as shown in FIGS. 1 and 2.

Figure 3K:
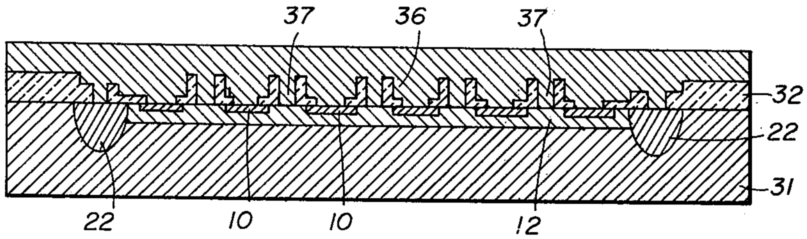

In FIG. 3K, the oxide layer 32 has been etched away at 37 in preparation for the formation of the base contacts 13. Also, in FIG. 3K, a layer of metal 36 has been deposited over the surface of the device by well-known metal deposition techniques.

Figure 3L:
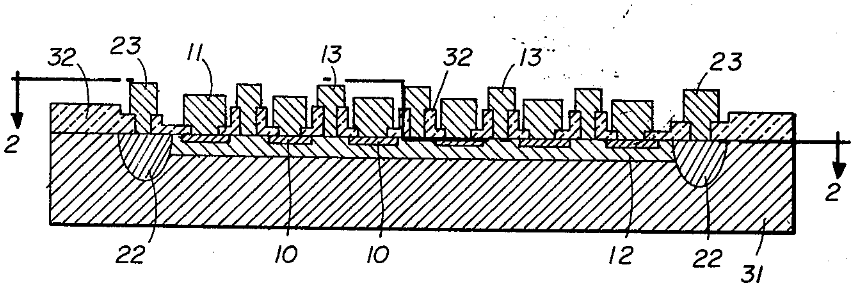

Finally, in FIG. 3L, the metal is etched away except over the base contacts 13 and emitter contacts 11. It is to be noted that with a device constructed in accordance with the teachings of the present invention, only one layer of metallization is necessary to form the base and emitter contacts and that thereby a considerable number of steps in the fabrication process are saved with resulting economics.

Figure 4:
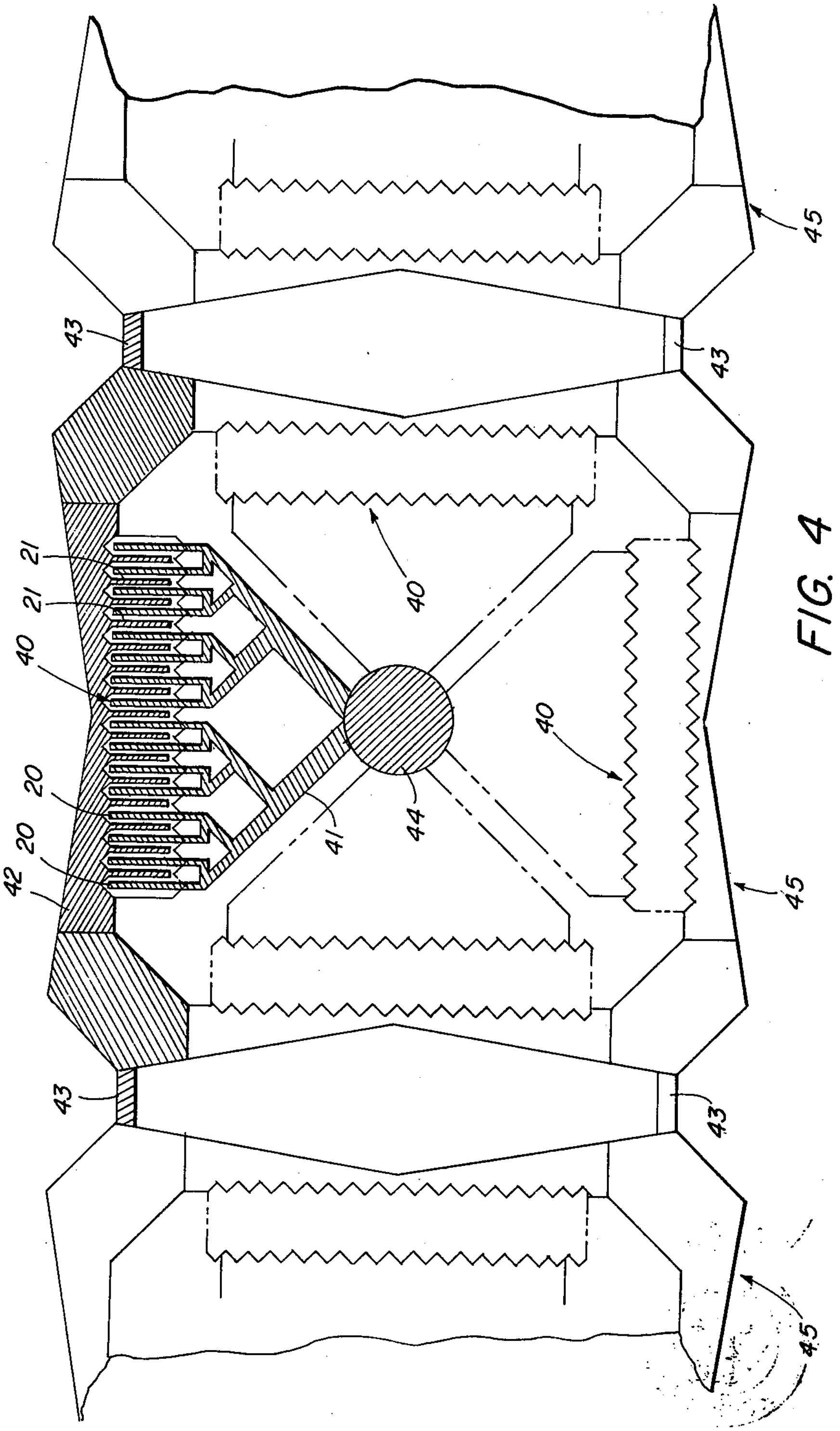
FIG. 4 is a plan view of a device wherein a number of microwave transistors are interconnected.

In the fabrication of microwave transistor devices, a plurality of transistor cells are manufactured from the same slice of silicon to match characteristics, connected in parallel and mounted within a single case in order to achieve greater power handling capabilities than are possible with a single transistor cell device. At the same time, mounting several transistors cells in a single package may give rise to heat dissipation problems unless attention is paid to the arrangement of the individual transistors within the package. The layout arrangement shown in FIG. 4 provides both good thermal flow characteristics and low interelectrode capacitance.

Four transistor cells 40 are arranged along the sides of a square to form a four transistor array 45. As many arrays 45 as are required may be interconnected within a package to form the completed device. At each transistor cell 40 emitter contact fingers 20 extend over the transistor cell 40 and connect with the emitter contacts 11 as was shown in FIG. 2. The emitter contact fingers 20 are connected through an interconnection grid 41 to a central emitter contact point 44 where the emitters from all four transistor cells 40 within the array 45 are similarly connected. If the transistor cells 40 had been arranged in a linear parallel array, it would not be possible to have the single central emitter contact. The emitter to collector capacitance is greatly reduced with the arrangement of FIG. 4 in that the total surface area of interconnecting metal is reduced and greater separation of connections to the different elements is possible than with a linear array.

The base contact fingers 21 also extend over the transistor cell 40 and make contact with the base contacts 13 and guard ring contacts 23 as was shown in FIG. 2. The base contact fingers 21 are interconnected by a metal strip 42 extending around the periphery of the array 45 and are connected between arrays 45 through contacts 43. The collector 31 of each transistor cell 40 is formed on its underside as shown in FIG. 3A and is contacted through the substrate 30. Correspondingly, the collectors 31 are interconnected on the underside of the array 45. The interconnected arrays 45 are then mounted on an underlying support preferably BeO which is capable of conducting heat away from the arrays 45.

With a transistor constructed according to the teachings of the present invention, the power dissipation due to each emitter is approximately uniform through a planar cross section of the device. However, since heat flow away from the heat producing regions is predominantly downwards and outwards towards the periphery, the temperature in the center of the transistor is somewhat higher than near the periphery. If the transistors were to be arrayed linearly with the longer sides in parallel only a slight decrease in center temperature is achieved through thermal coupling between transistors. With the arrangement of FIG. 4, however, the thermal coupling between transistors is much greater at the ends of the transistor cells than at the centers. This arrangement results in a much more uniform temperature distribution through each transistor than is possible with a linear array.

This concludes the detailed description of the preferred embodiments of the present invention. However, many modifications and alterations of the present invention would be apparent to one skilled in the art. For example, the invention could be employed in a field effect transistor or in a photosensitive type transistor. Furthermore, the device geometry may include oval, elliptical, parallelogrammatic and other shapes as well as the diamond shape. Therefore, it is not intended that the invention as defined in the following claims be limited to the scope of the preferred embodiment but that numerous modifications and variations may be made thereto without departing from the spirit and scope of the invention.

What is claimed is:

1. A semiconductor device comprising:

a semiconductor planar substrate of a first conductivity type;

a collector region of the said first conductivity type, said collector region being contiguous to said substrate;

a base region of a second conductivity type, said base region being contiguous to said collector region;

a plurality of connections to said base region, said connections being arranged in transverse substantially linear rows and columns;

a plurality of substantially separate emitter regions of said first conductivity type, said emitter regions being contiguous to said base region, said emitter regions being located substantially at the center of four of the said connections to said base region wherein the said four connections are adjacent one another; and said emitter regions having a substantially diamond shape, the ratio of the length of the junction between each of said emitter regions and said base region at the intersection of said junction with the surface of said semiconductor device to the area of said base region in contact with said collector region divided by the number of said emitter regions being greater than $(5/6)\cdot(1/w)$, $w$ being the linear distance between the two most proximate angles along said junction at said surface.

2. The combination of claim 1 wherein said first conductivity type is N-type material and said second conductivity type is P-type material.

3. A complex transistor device with four transistor device bodies interconnected therein comprising in combination:

four transistor bodies, said bodies being substantially rectangular in shape and said bodies being arranged in a square with the longer sides of each of said bodies being in parallel with the sides of said square and said transistor bodies being separated from one another;

means to support said transistor bodies, said means having first and second planar surfaces;

a first set of conductive fingers coupled to emitter contacts of said transistor bodies, said first set of conductive fingers being interconnected at the center of said square;

a second set of conductive fingers coupled to base contacts of said transistor bodies, said second set of conductive fingers being interconnected at the periphery of said square on said first planar surface of said means to support said transistor bodies, wherein each of said transistor bodies comprises:

a semiconductor planar substrate of a first conductivity type;

a collector region of the said first conductivity type, said collector region being contiguous to said substrate;

a base region of a second conductivity type, said base region being contiguous to said collector region;

a plurality of connections to said base region, said connections being arranged in transverse substantially linear rows and columns;

a plurality of substantially separate emitter regions of said first conductivity type, said emitter regions being contiguous to said base region, said emitter regions being located substantially at the center of four of the said connections to said base region wherein the said four connections are adjacent one another; and said emitter regions having a substantially diamond shape, the ratio of the length of the junction between each of said emitter regions and said base region at the intersection of said junction with the surface of said semiconductor device to the area of said base region in contact with said collector region divided by the number of said emitter regions being greater than $(5/6)\cdot(1/w)$, $w$ being the linear distance between the two most proximate angles along said junction at said surface.

4. The combination of claim 3 further comprising:

means for providing one or more connections to said region of semiconductor material of a first conductivity type; and means for providing a connection to each region of said plurality of regions of said first conductivity type.

5. The combination of claim 4 further comprising:

means for interconnecting said plurality of connections to said region of semiconductor material of said second conductivity type; and means for interconnecting each of said connections to each region of said plurality of regions of said first conductivity type.

6. The combination of claim 3 further comprising means for coupling said transistor device to input signal providing means and output signal utilization means in an amplifying circuit.

7. The combination of claim 6 further comprising means for supplying bias voltage to said transistor device.

8. The combination of claim 7 wherein said coupling means comprises impedance matching means for matching input and output impedances of said transistor device to said amplifying circuit.

* * * * *